(12) United States Patent
Furukawa et al.

(10) Patent No.: US 7,327,156 B2
(45) Date of Patent: Feb. 5, 2008

(54) LSI TESTING APPARATUS FOR TESTING AN ELECTRONIC DEVICE

(75) Inventors: Yasuo Furukawa, Tokyo (JP); Masahiro Ichinomiya, Tokushima (JP); Masaki Hashidume, Tokushima (JP); Takeomi Tamesada, Tokushima (JP)

(73) Assignee: Advantest Corporation, Tokyo (JP)

(*) Notice: Subject to any disclaimer, the term of this patent is extended or adjusted under 35 U.S.C. 154(b) by 90 days.

(21) Appl. No.: 11/434,602

(22) Filed: May 15, 2006

(65) Prior Publication Data

US 2006/0232293 A1    Oct. 19, 2006

Related U.S. Application Data

(60) Division of application No. 11/271,617, filed on Nov. 10, 2005, now Pat. No. 7,075,326, which is a division of application No. 10/600,919, filed on Jun. 20, 2003, now Pat. No. 6,992,497, which is a continuation of application No. PCT/JP01/11623, filed on Dec. 28, 2001.

(30) Foreign Application Priority Data

Dec. 28, 2000    (JP)    ............................ 2000-401987

(51) Int. Cl.
    *G01R 31/02*    (2006.01)

(52) U.S. Cl. ....................................................... 324/765
(58) Field of Classification Search ........ 324/574–765, 324/7, 500–501; 714/730–734, 724; 438/14–18; 713/401
See application file for complete search history.

(56) References Cited

U.S. PATENT DOCUMENTS

| | | | |
|---|---|---|---|
| 5,481,551 A * | 1/1996 | Nakano et al. ............. 714/740 |
| 5,521,517 A * | 5/1996 | Shida et al. ................ 324/751 |
| 6,246,248 B1 * | 6/2001 | Yamagishi .................. 324/763 |
| 6,717,428 B1 * | 4/2004 | Spica .......................... 324/765 |

* cited by examiner

*Primary Examiner*—Vinh P. Nguyen
(74) *Attorney, Agent, or Firm*—Osha•Liang LLP

(57) ABSTRACT

AN LSI testing apparatus includes a power source unit for supplying the direct source current to an electronic device, a detecting unit for detecting the source current supplied to the electronic device and a judging unit for judging the quality of the electronic device, wherein the power source unit includes a unit for overlaying overlaid signals with a predetermined period on the source current, and the judging unit judges the quality of the electronic device on the basis of the source current detected by the detecting unit in case the electronic device is supplied with the source voltage on which the overlaid signals are overlaid.

6 Claims, 10 Drawing Sheets

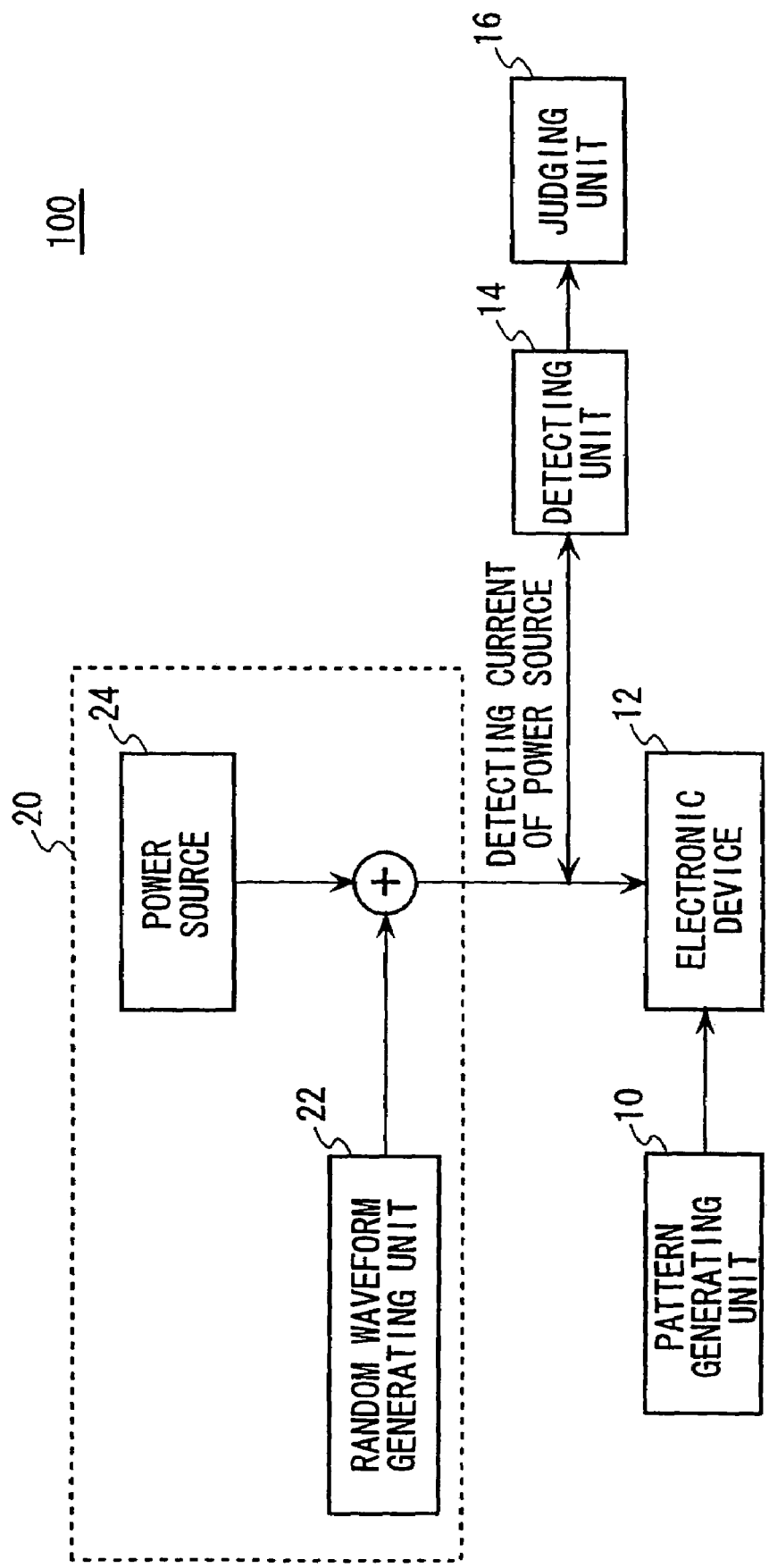

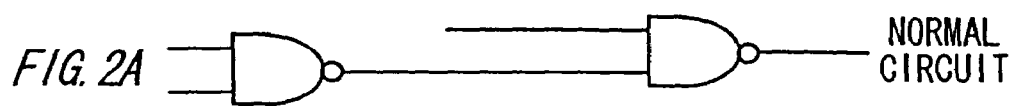
FIG. 2A  NORMAL CIRCUIT
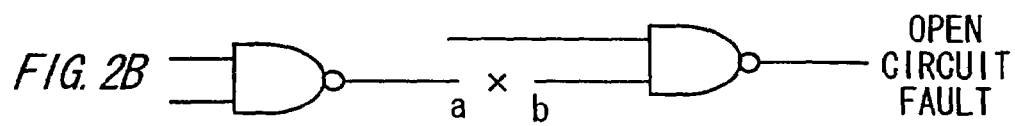
FIG. 2B  OPEN CIRCUIT FAULT
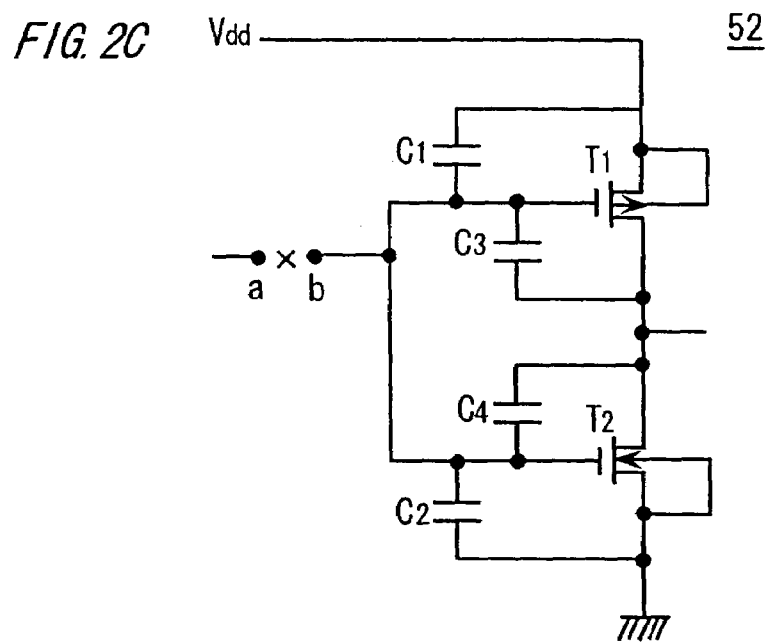
FIG. 2C
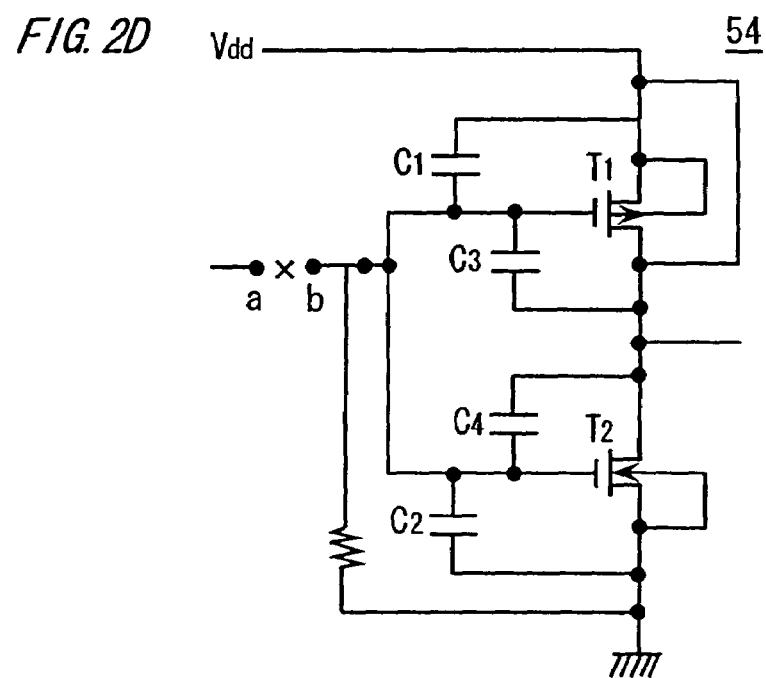
FIG. 2D

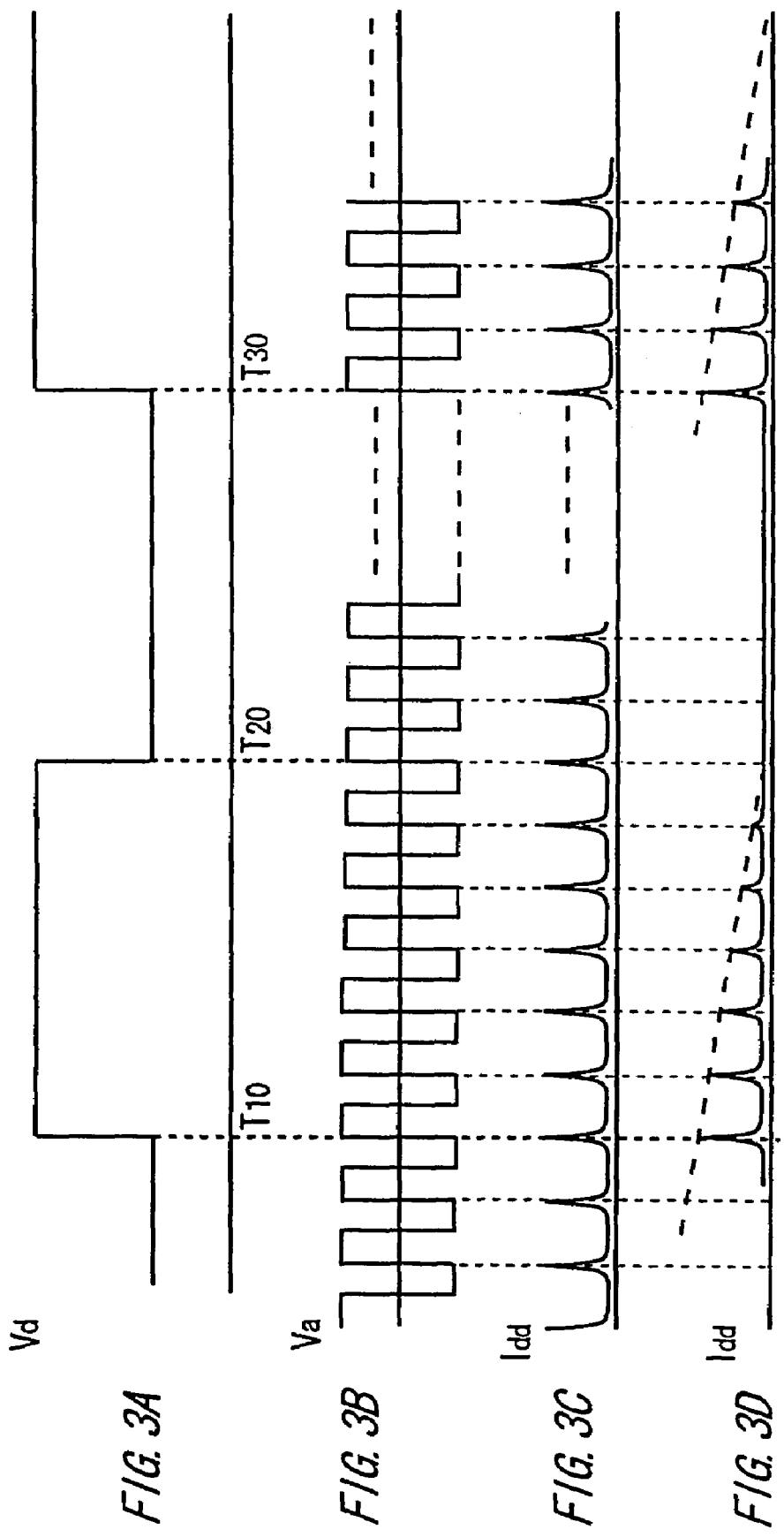

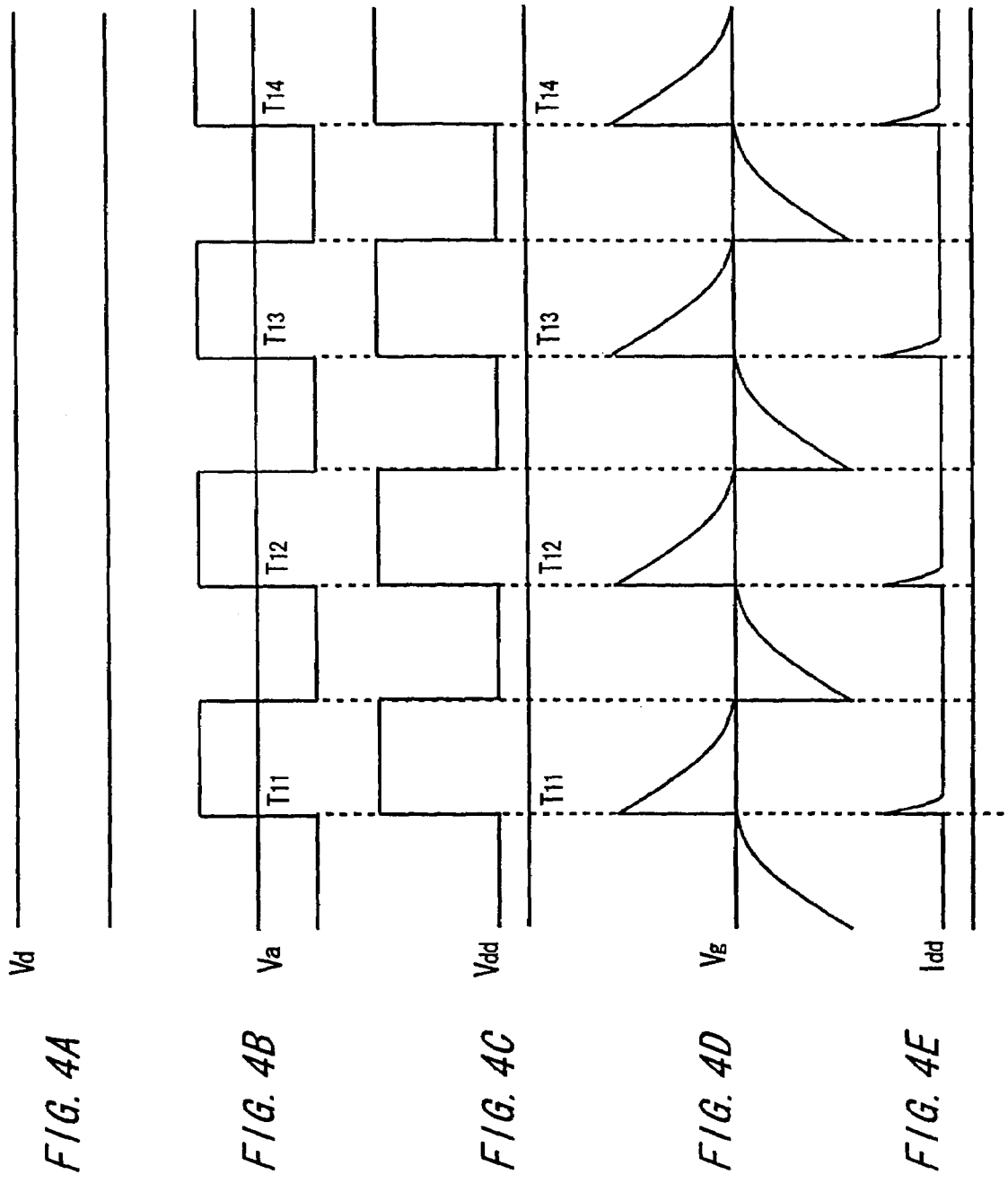

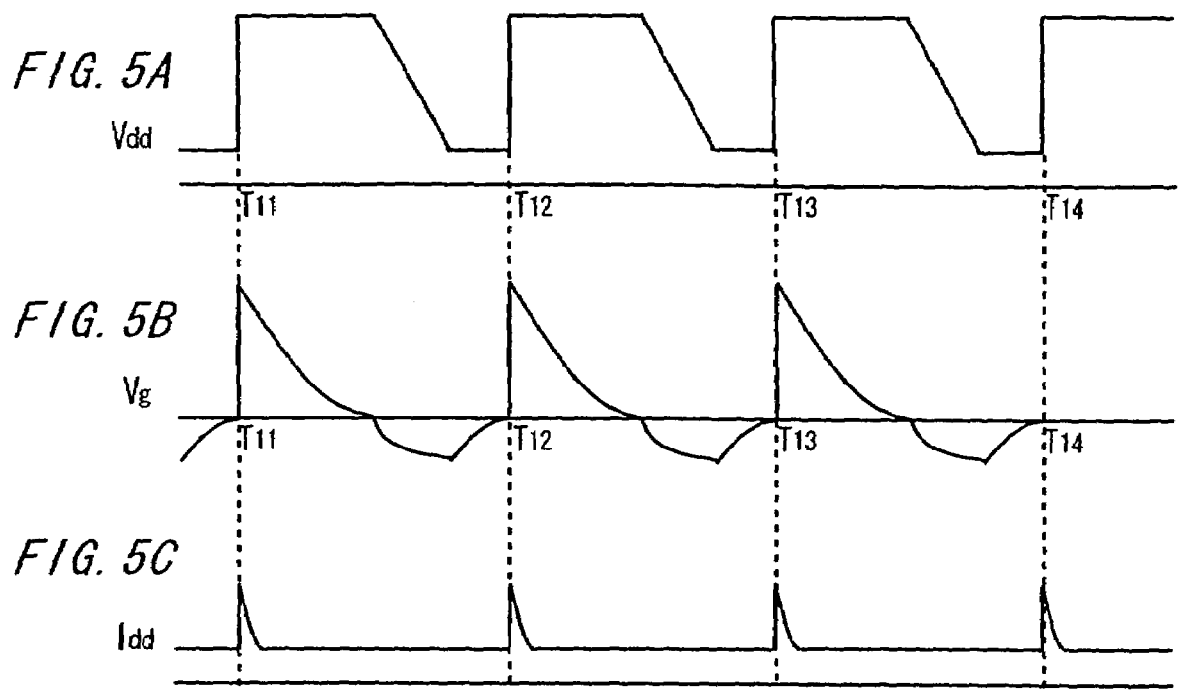

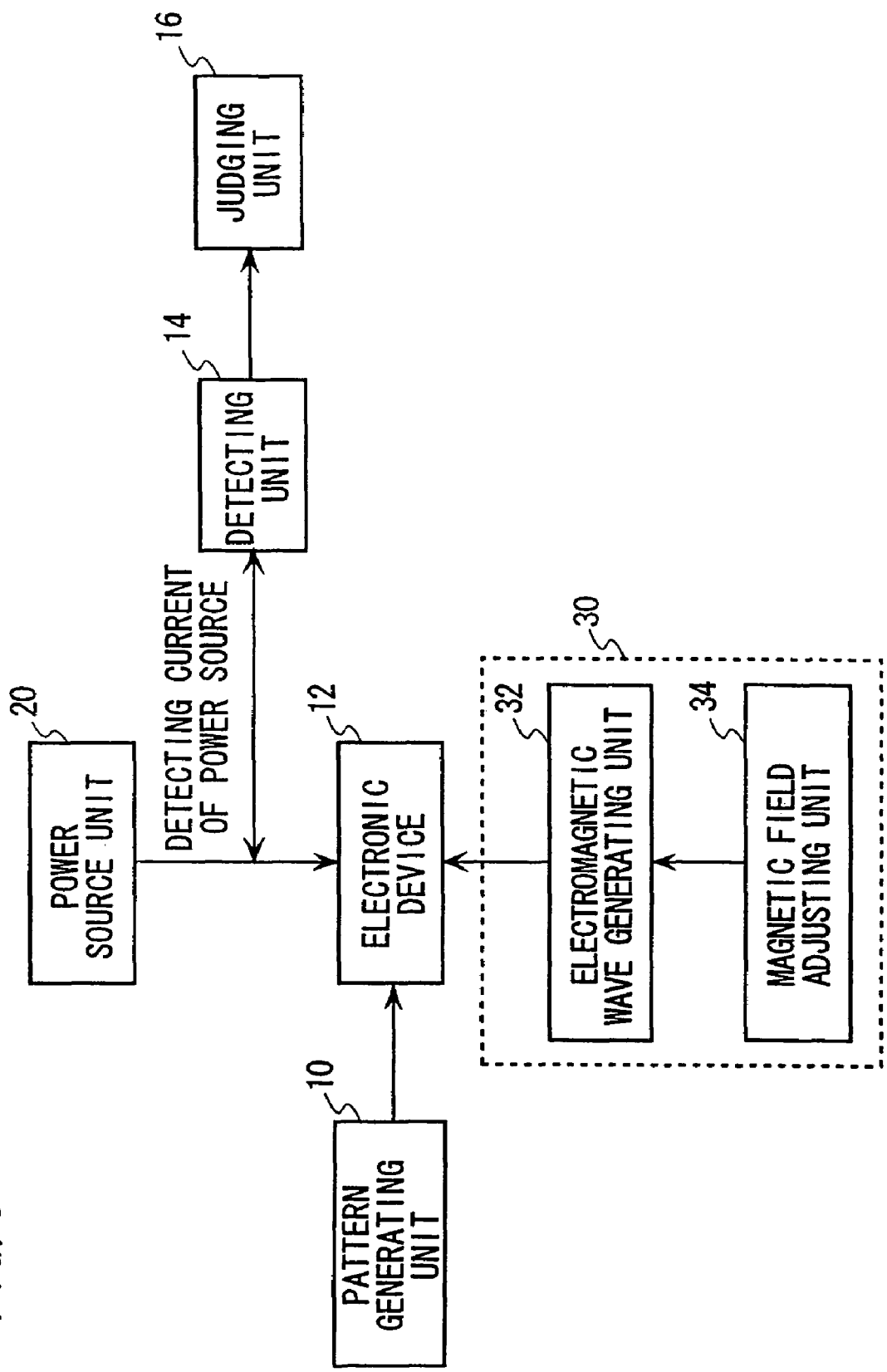

LSI TESTING APPARATUS FOR TESTING AN ELECTRONIC DEVICE

The present application is a divisional application of U.S. patent application Ser. No. 11/271,617, filed on Nov. 10, 2005, now U.S. Pat. No. 7,075,326, which is a divisional application of U.S. patent application Ser. No. 10/600,919, filed Jun. 20, 2003, now U.S. Pat. No. 6,992,497, which is a continuation application of PCT application No. PCT/JP01/11623 filed on Dec. 28, 2001, which claims priority from Japanese patent application No. 2000-401987 filed on Dec. 28, 2000, the contents of which are enclosed herein by reference.

FIELD OF THE INVENTION

The present invention relates to an LSI testing apparatus for testing an electronic device. More particularly, the present invention relates to an LSI testing apparatus, which judges the quality of the electronic device on the basis of the source current of the electronic device.

RELATED ART

Recently, a great many semiconductor devices have been manufactured. The manufactured semiconductor devices need to be examined whether there is any fault in them with the semiconductor testing apparatus before they are introduced into the market. The semiconductor testing apparatus judges the quality of the semiconductor devices by performing a test called 'function test' on them. In respect of the function test, the quality of the semiconductor devices is judged on the basis of the output result from the output of the semiconductor devices to which the test patterns are provided.

These days, the research on the large-scale integration of the semiconductor devices is being in progress actively. Due to the large-scale integration of the semiconductor devices, the test patterns regarding the function test have been complicated and it also has been difficult to generate the test patterns. In addition, it is actually impracticable to perform the function test perfectly on all of the devices for all possibilities whether they have any faults, because the number of the test patterns is enormous so it takes too much time to perform the test.

Apart from the function test, as a test method developed for performing the test effectively, there is a method called 'quiescent supply current test', where the quiescent supply current of the semiconductor devices are measured. In this method, from the fact that a normal transistor does not draw any significant current when in a stable situation, the quality of the semiconductor devices is judged by detecting the abnormal current in the quiescent state. There has been, in the conventional quiescent supply current test, a case that it is difficult to detect the abnormal current by the inputted patterns, and also been a problem that it is difficult to discriminate the abnormal current from the noise.

Therefore, it is an object of the present invention to provide an LSI testing apparatus, which is capable of overcoming the above drawbacks accompanying the conventional art. The above and other objects can be achieved by combinations described in the independent claims. The dependent claims define further advantageous and exemplary combinations of the present invention.

SUMMARY OF THE INVENTION

According to an aspect of the present invention, an LSI testing apparatus for testing an electronic device includes a power source unit for supplying a source voltage of direct current to the electronic device, a detecting unit for detecting a source current with which the electronic device is supplied by the power source unit and a judging unit for judging quality of the electronic device, wherein the power source unit comprises means for overlaying an overlaid signal with a predetermined period on the source voltage, the judging unit judges the quality of the electronic device on the basis of the source current detected by the detecting unit in case the electronic device is supplied with the source voltage on which the overlaid signal is overlaid.

The power source unit may include means for changing a signal level of the overlaid signal, and the judging unit may judge the quality of the electronic device for each signal level of the overlaid signal. The power source unit may include means for changing a frequency of the overlaid signal. The judging unit may judge the quality of the electronic device on the basis of a difference between a source current, which should be supplied to the electronic device, in case the electronic device is supplied with the source voltage and a source current detected by the detecting unit in case the electronic device is supplied with the source voltage on which the overlaid signal is overlaid and a period of the overlaid signal. The judging unit may judge the quality of the electronic device on the basis of a difference between a spectrum of a source current, which should be supplied to the electronic device, in case the electronic device is supplied with the source voltage on which the overlaid signal is overlaid and a spectrum of a source current detected by the detecting unit in case the electronic device is supplied with the source voltage on which the overlaid signal is overlaid. The judging unit may judge the quality of the electronic device on the basis of a magnitude of a predetermined frequency component of the source current detected by the detecting unit in case the electronic device is supplied with the source voltage on which the overlaid signal is overlaid.

AN LSI testing apparatus may further include a pattern generating unit for providing a test pattern to the electronic device, wherein the judging unit judges the quality of the electronic device on the basis of the source current detected by the detecting unit under a condition, where the test pattern is provided to the electronic device. The electronic device may include a plurality of semiconductor devices, and the pattern generating unit may provide the electronic device with the test pattern by which all of the plurality of semiconductor devices operate at least once.

AN LSI testing apparatus may further include an electromagnetic wave generating unit for generating an electromagnetic wave with a predetermined frequency, wherein the judging unit judges the quality of the electronic device on the basis of the source current detected by the detecting unit under a condition, where the electromagnetic wave generated by the electromagnetic wave generating unit is provided to the electronic device. The frequency of the electromagnetic wave generated by the electromagnetic wave generating unit may be approximately the same as a frequency of the over laid signal. The electromagnetic wave generating unit may include means for changing an intensity of the electromagnetic wave, which is generated. The electromagnetic wave generating unit may include means for changing a frequency of the electromagnetic wave, which is generated. The electromagnetic wave generating unit may include a first generator for generating an electromagnetic wave with a first frequency and a second generator for generating an electromagnetic wave with a second frequency, wherein a position in which the first generator is provided is different from a position in which the second generator is provided.

The electromagnetic wave generating unit may include a magnetic field adjusting unit for adjusting at least one of a position and a direction of the first generator and the second generator. The judging unit may judge the quality of the electronic device further on the basis of the frequency of the electromagnetic wave generated by the electromagnetic wave generating unit.

AN LSI testing apparatus may further include an alternating electric field generating unit for generating an alternating electric field with a predetermined frequency, wherein the judging unit judges the quality of the electronic device on the basis of the source current detected by the detecting unit under a condition, where the alternating electric field generated by the alternating electric field generating unit is provided to the electronic device. The frequency of the alternating electric field generated by the alternating electric field generating unit may be approximately the same as a frequency of the overlaid signal. The alternating electric field generating unit may include means for changing an intensity of the alternating electric field. The alternating electric field generating unit may include means for changing a frequency of the alternating electric field. The judging unit may judge the quality of the electronic device further on the basis of the frequency of the alternating electric field generated by the alternating electric field generating unit. The electronic device may include a plurality of semiconductor devices to which the power source unit supplies the source current on which the overlaid signal is overlaid, and the alternating electric field generating unit may include an electric field probe for providing the alternating electric field to an input to at least one of the plurality of semiconductor devices.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

BRIEF DESCRIPTION OF DRAWINGS

FIG. 1 shows an example of the configuration of the LSI testing apparatus 100 according to the first embodiment of the present invention.

FIG. 2 shows an example of the circuit included in the electronic device 12.

FIG. 3 shows an example of the overlaid signals $V_a$ and the source current $I_{dd}$, which is detected.

FIG. 4 shows the enlarged view of an example of a part of the waveforms during $T_{10}$ to $T_{20}$.

FIG. 5 shows another example of the waveforms shown in FIG. 4.

FIG. 6 shows another example of the configuration of the LSI testing apparatus 100 according to this invention.

DETAILED DESCRIPTION OF THE INVENTION

Figure 7:
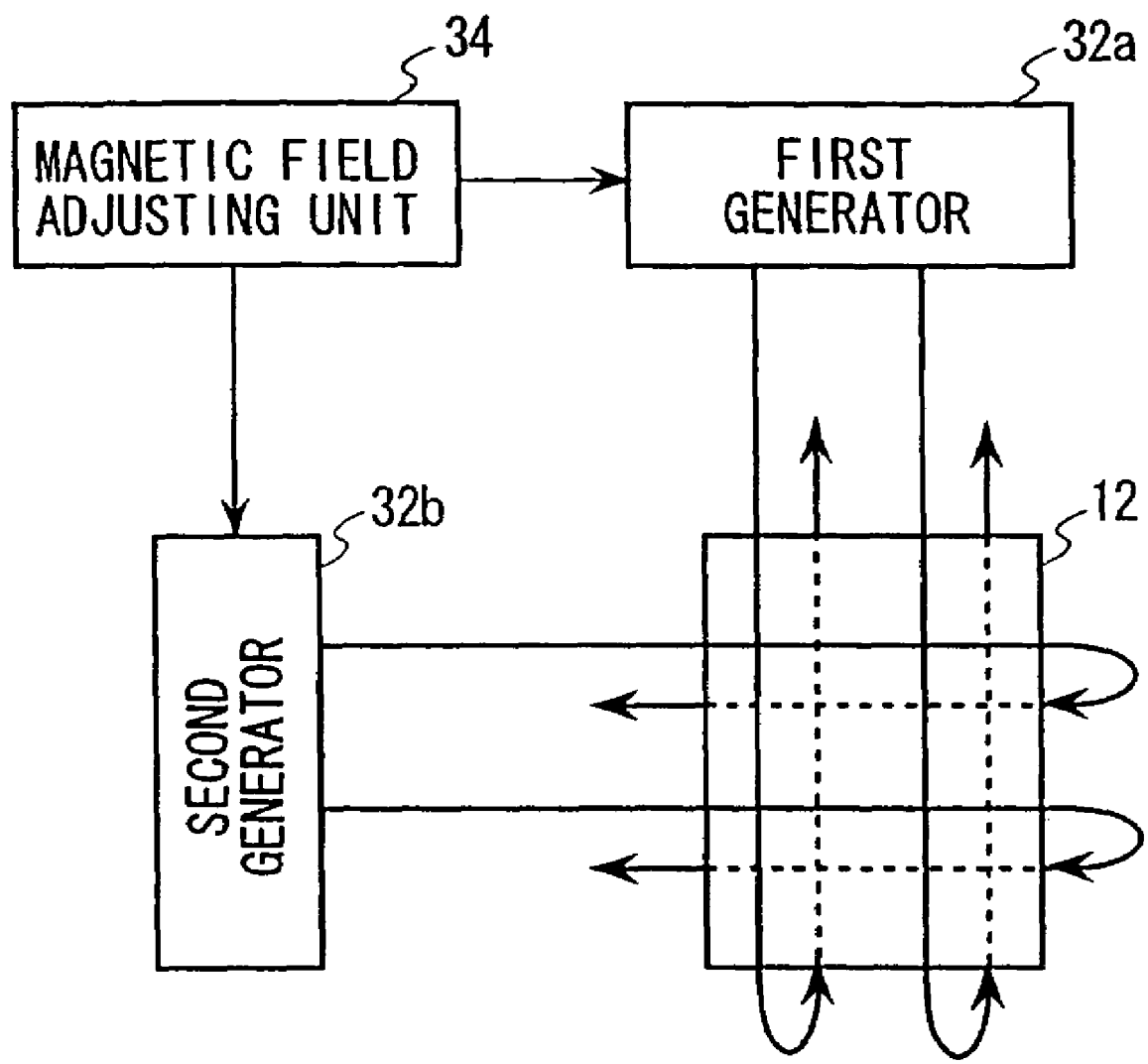
FIG. 7 shows the magnetic field generated by the first generator 32a and the second generator 32b.

The invention will now be described based on the preferred embodiments, which do not intend to limit the scope of the present invention, but exemplify the invention. All of the features and the combinations thereof described in the embodiment are not necessarily essential to the invention.

FIG. 1 shows an example of the configuration of the LSI testing apparatus 100 according to the first embodiment of the present invention. The LSI testing apparatus 100 includes a pattern generating unit 10, a power source unit 20, a detecting unit 14 and a judging unit 16. In the preset invention, the electronic device 12 to be tested may include a digital circuit with a plurality of semiconductor devices or a digital/analog combined circuit. In this invention, it is preferable that the LSI testing apparatus 100 should perform the test on the digital circuit, after the analog circuit of the electronic device 12 is off, in case of the digital/analog combined circuit.

The pattern generating unit 10 generates the test patterns to test the electronic device 12 and provides them to the electronic device 12. It is preferable that the pattern generating unit 10 generates various test patterns corresponding to the test items for the test of the electronic device 12. For example, it is preferable that the pattern generating unit 10 provides the electronic device 12 with the test patterns by which all of the plurality of the semiconductor devices operate at least once. Moreover, the pattern generating unit 10 may provide the electronic device 12 with the test patterns, where the input signal organization is arranged corresponding to each input for a few of the semiconductor devices of the electronic device 12, in order that the output of the block circuit, which includes the few of the semiconductor devices, is not decided by one of the few of the semiconductor devices. In addition, the pattern generating unit 10 may provide the electronic device 12 with the random test patterns.

The power source unit 20 supplies the electronic device 12 with the source voltage to drive the semiconductor devices of the electronic device 12. The power source unit 20 includes means for overlaying the overlaid signals with a predetermined period on the source voltage. For example, the power source unit 20 may include a power source 24 for generating the source voltage, a random waveform generating unit 22 for generating the overlaid signals and a summing unit for overlaying the overlaid signals on the source voltage. Moreover, it is preferable that the power source unit 20 includes means for changing the signal level of the overlaid signals. For example, the power source unit 20 may change the signal level at every test cycle, and the judging unit 16 may judge the quality of the electronic device 12 for each of the signal level. In addition, it is preferable that the power source unit 20 includes means for changing the frequency of the overlaid signals. The detecting unit 14 detects the source current with which the electronic device 12 is supplied from the power source unit 20 on the basis of the source voltage, which the power source unit 20 supplied to the electronic device 12. The detecting unit 14 sends the information about the detected source current to the judging unit 16.

The judging unit 16 judges the quality of the electronic device 12 on the basis of the source current detected by the detecting unit 14. The judging unit 16 judges the quality of the electronic device 12 on the basis of the source current detected by the detecting unit 14 in case the electronic device 12 is provided with the signals, where the overlaid signals generated by the random waveform generating unit 22 are overlaid on the source voltage generated by the power source 24. For example, the judging unit 16 may judge the quality of the electronic device 12 on the basis of the difference between the source current, which should be supplied to the electronic device 12, in case the electronic device 12 is supplied with the source voltage generated by the power source 24 and the source current detected by the detecting unit 14 in case the electronic device 12 is supplied with the source voltage on which the over laid signals are overlaid. In other words, the judging unit 16 may compare the waveform of the source current in case the source voltage is supplied to the electronic device 12 with the waveform of the source current in case the electronic device 12 is supplied with the source voltage on which the overlaid signals are overlaid, extract the current components, which the latter source current does not have but the former source current have, and judge the quality of the electronic device 12 on the basis of the extracted current components.

Moreover, the judging unit 16 may judge the quality of the electronic device 12 on the basis of the difference between the spectrum of the source current, which should be supplied to the electronic device 12, in case the electronic device 12 is supplied with the source voltage on which the overlaid signals are overlaid and the spectrum of the source current detected by the detecting unit 14 in case the electronic device 12 is supplied with the source voltage on which the overlaid signal is overlaid. In other words, the judging unit 16 may compare the spectrum of the source current supplied to the electronic device of good quality in case the electronic device of good quality is supplied with the source voltage on which the overlaid signals are overlaid with the spectrum of the source current supplied to the electronic device 12 to be tested in case the electronic device 12 to be tested is supplied with the source voltage on which the overlaid signals are overlaid and judge the quality of the electronic device 12 to be tested. Due to the analysis of spectrum, it is possible to judge the quality of the electronic device 12 with higher precision. In addition, due to the analysis of spectrum, it is possible to perform the analysis of the electronic device 12 in detail. It is preferable that the spectrum of the source current in case the electronic device 12 is supplied with the source voltage on which the overlaid signals are overlaid is determined in advance.

It is preferable that the judging unit 16 judges the quality of the electronic device 12 by comparing the period of the current components with the period of the overlaid signals. For example, if there is any defect such as the open circuit in the circuit of the electronic device 12, the abnormal current components with a period approximately synchronized with the period of the overlaid signals arise in the source current detected by the detecting unit 14. For this reason, by comparing the period of the current components with the period of the overlaid signals, it is possible to judge the quality of the electronic device 12 without difficulty. Moreover, by changing the test patterns generated by the pattern generating unit 10, it is possible to specify the defect spot on the circuit of the electronic device 12 with ease. In addition, the judging unit 16 may judge the quality of the electronic device 12 on the basis of the magnitude of the predetermined frequency components of the source current detected by the detecting unit 14 in case in case the electronic device 12 is supplied with the source voltage on which the overlaid signals are overlaid. In this embodiment, the LSI testing apparatus 100 includes the pattern generating unit 10, and the judging unit 16 judges the quality of the electronic device 12 on the basis of the source current detected by the detecting unit 14 under the condition, where the test patterns are inputted to the electronic device 12. Moreover, according to another embodiment, the LSI testing apparatus 100 may not include the pattern generating unit 10, and the judging unit 16 may judge the quality of the electronic device 12 on the basis of the source current detected by the detecting unit 14 under the condition, where the test patterns are inputted to the electronic device 12.

FIGS. 2A to 2D show an example of the circuit included in the electronic device 12. Specifically, FIG. 2A shows an example of the normal circuit. As shown in FIG. 2A, the output of an inverter is used for the input of the next inverter. FIG. 2B shows the circuit with an open defect regarding the circuit shown in FIG. 2A. In the circuit shown in FIG. 2B, the open defect occurs between a and b. FIG. 2C shows the circuit 52 as an example of the circuit in detail, where the open defect shown in FIG. 2B occurs.

In the circuit 52, the upper transistor $T_1$ is the n-channel FET, and the lower transistor $T_2$ is the p-channel FET. And, the capacitances $C_1$, $C_2$, $C_3$ and $C_4$ are, for example, the parasitic capacitance. The bias voltage $V_{dd}$ from the power source unit 20 (cf. FIG. 1) is given to the transistor $T_1$. In the circuit 52, if the open defect does not occur between a and b, the test patterns are inputted to the gate of the transistor $T_1$, so the transistor $T_1$ is turned on/off on the basis of the test patterns. In this case, although the overlaid signals are overlaid on the source voltage from the power source unit 20, the change of the source voltage does not influence the on/off of the transistor $T_1$. Therefore, the current patterns based on the test patterns are detected in the source current detected by the detecting unit 14 (cf. FIG. 1).

In the circuit 52, if the open defect occurs between a and b, the voltage base on the source voltage is supplied to the gate of the transistor $T_1$. If the predetermined overlaid signals are overlaid on the source voltage, the transistor $T_1$ is turned on/off on the basis of the overlaid signals, so the detecting unit 14 detects the source current with the current patterns on the basis of the overlaid signals. The judging unit 16 excludes the effect of the noise for example by comparing the period or the frequency components of the current patterns with the period of the overlaid signals and extracts the current components included in the source current resulting form the overlaid signals, so it is capable of detecting the defect spot in the electronic device 12.

FIG. 2D shows the circuit 54 as another example of the circuit in detail, where the open defect shown in FIG. 2B occurs. The open terminal b in the circuit 54 is, in contrast to the circuit 52, connected to the GND potential via a high resistance. Since the open end b is connected to the GND potential via the resistance, when the voltage is not supplied from the $V_{dd}$, the approximate zero potential is given to the gate of the transistor $T_1$, so the transistor $T_1$ is always in the 'on' state. When the voltage is supplied from the $V_{dd}$, under the initial condition, the voltage based on the voltage division for the parasitic capacitances $C_1$ and $C_2$ and the resistance R is applied to the gate of the transistor $T_1$. The voltage applied to the gate of the transistor $T_1$ becomes close to the approximate GND potential gradually, so the transistor $T_1$ turns on/off at the threshold value of the transistor $T_1$. As the source voltage changes, the voltage base on the voltage division for the parasitic capacitances $C_1$ and $C_2$ and the resistance R is applied again to the gate of the transistor $T_1$ toward the initial condition before the change. Therefore, if the overlaid signals are overlaid on the source voltage, the transistor $T_1$ turns on/off on the basis of the overlaid signals so that the detecting unit 14 detects the source current having the current components base on the overlaid signals. The operation of the circuit 52 and 54 and an example of the source current, which is detected, are described below by using an example of the overlaid signals overlaid on the source voltage.

FIGS. 3A to 3D show an example of the overlaid signals $V_a$ and the source current $I_{dd}$, which is detected. FIG. 3A shows an example of the source voltage $V_d$ generated by the power source unit 20. In each drawing of FIG. 3, the horizontal axis represents the time, and the vertical axis represents the amplitude of the voltage or the current. FIG. 3B shows an example of the overlaid signal $V_a$. The power source unit 20 supplies $V_{dd}$ of the circuit 52 or 54 with the signals, where the overlaid signals $V_a$ shown in FIG. 3B are overlaid on the source voltage $V_d$ shown in FIG. 3A. FIG. 3C shows an example of the source current $I_{dd}$ supplied from $V_{dd}$ of the circuit (cf. FIG. 2). As described regarding FIG. 2C, if the predetermined overlaid signals $V_a$ are overlaid on the source voltage $V_d$, the transistor $T_1$ is turned on/off on the basis of the overlaid signals $V_a$, so the detecting unit 14 detects the source current with the current patterns on the basis of the overlaid signals $V_a$. As shown in FIG. 3C, the current components with the period approximately synchronized with the period of the overlaid signals $V_a$ are detected. The detecting unit 16 detects the quality of the electronic device 12 on the basis of the current components.

FIG. 3D shows an example of the source current $I_{dd}$ supplied from the $V_{dd}$ of the circuit 54 (cf. FIG. 2). As described regarding FIG. 2D, since the open end b in the circuit 54 is connected to the GND potential via the high resistance, the voltage applied to the gate of the transistor $T_1$ becomes close to the zero potential according to the time lapse. For this reason, as shown in FIG. 3D, the current components with the period approximately synchronized with the period of the overlaid signals $V_a$ diminish slowly. According to the LSI testing apparatus 100, owing to detecting the source current supplied to the electronic device 12, it is possible to detect the defect such as the open defect. Moreover, as the current waveform shown in FIGS. 3C and 3D, owing to detecting the magnitude of the predetermined frequency components of the source current Idd, it is possible to judge such defect mode that the high resistance as the parasitic resistance is connected.

FIGS. 4A to 4E shows the enlarged view of an example of a part of the waveforms during $T_{10}$ to $T_{20}$. And, in FIG. 4, the operation of the circuit 52 (cf. FIG. 2) is described as the example. In each drawing of FIG. 4, the horizontal axis represents the time, and the vertical axis represents the amplitude of the voltage or the current. FIG. 4A shows the enlarged view of a part of FIG. 3A. FIG. 4B shows the enlarged view of a part of FIG. 3B. FIG. 4C shows the signals, where the overlaid signals $V_a$ shown in FIG. 4B are overlaid on the source voltage $V_d$ shown in FIG. 4A. FIG. 4D shows the voltage supplied to the gate of the transistor $T_1$ of the circuit 52, when the voltage shown in FIG. 4C is supplied to the electronic device 12 as the source voltage. FIG. 4E shows an example of the source current, which the detecting unit 14 detects, when the voltage shown in FIG. 4C is supplied to the electronic device 12 as the source voltage.

Since the transistor $T_1$ of the circuit 52 is the n-channel FET, when the gate voltage $V_g$ shown in FIG. 4D is supplied, the transistor $T_1$ turns on/off only at the first of the positive part of the gate voltage $V_g$. The source current $I_{dd}$ changes remarkably at the timing when the on/off occurs in respect of the transistor $T_1$. The timing when the source current $I_{dd}$ changes remarkably is approximately the same as the period of the overlaid signals $V_a$. Therefore, owing to detecting the frequency components of the source current $I_{dd}$, it is possible to detect the quality of the electronic device 12 without difficult.

FIGS. 5A to 5C show another example of the waveforms shown in FIG. 4. And, in FIG. 5 like FIG. 4, the operation of the circuit 52 (cf. FIG. 2) is described as the example. In each drawing of FIG. 5, the horizontal axis represents the time, and the vertical axis represents the amplitude of the voltage or the current. FIG. 5A shows the enlarged view of the voltage, where the overlaid signals with a predetermined period are overlaid on the source voltage $V_d$ shown in FIG. 3A. In FIG. 5A, the overlaid signals overlaid on the source voltage $V_c$ are the sawtooth waves with a gentle slope in contrast to the square waves shown in FIG. 4B. The square waves shown in FIG. 5A have the edge with the more gentle slope than the square waves shown in FIG. 4B. FIG. 5B shows the voltage supplied to the gate of the transistor $T_1$ of the circuit 52, when the voltage shown in FIG. 5A is supplied to the electronic device 12 as the source current. FIG. 5C shows an example of the source current detected by the detecting unit 14, when the voltage shown in FIG. 5A is supplied to the electronic device 12 as the source current.

Since the transistor $T_1$ of the circuit 52 is the n-channel FET, when the gate voltage $V_g$ shown in FIG. 5B is supplied, the transistor $T_1$ turns on/off only at the first of the positive part of the gate voltage $V_g$. The source current $I_{dd}$ changes remarkably at the timing when the on/off occurs in respect of the transistor $T_1$. The timing when the source current $I_{dd}$ changes remarkably is approximately the same as the period of the overlaid signals $V_a$. Therefore, owing to detecting the frequency components of the source current $I_{dd}$ it is possible to detect the quality of the electronic device 12 without difficult. Moreover, as shown in FIG. 5A, owing to the gentle slope in the waveform of the overlaid signals, it is possible to diminish the magnitude of the negative voltage in respect of the gate voltage, so the load of the transistor $T_1$ is reduced, and the breakdown of the transistor resulting from the test can be prevented. It is preferable that the power source unit 20 (cf. FIG. 1) overlays the overlaid signals having the waveform with the descending time longer than the first initiation time on the source voltage.

FIG. 6 shows another example of the configuration of the LSI testing apparatus 100, according to this invention. The LSI testing apparatus 100 includes a pattern generating unit 10, a power source unit 20, a detecting unit 14, a judging unit 16 and an electromagnetic wave generating unit 30. In respect that the symbols given to FIG. 6 are the same as those of FIG. 1, they may have the same function and configuration as described regarding FIG. 1 to FIG. 5. In this embodiment, the pattern generating unit 10, the power source unit 20 and the detecting unit 14 have the same function and configuration as the pattern generating unit 10, the power source unit 20 and the detecting unit 14, which are described regarding FIG. 1 to FIG. 5.

The electromagnetic wave generating unit 30 generates the electromagnetic wave with a predetermined frequency. The judging unit 16 judges the quality of the electronic device 12 on the basis of the source current detected by the detecting unit 14 under the condition, where the electromagnetic wave generated by the electromagnetic wave generating unit 30 is provided to the electronic device 12. If the electronic device 12 includes the circuit having the open defect described in regard to FIG. 2, the provision of the electromagnetic wave to the electronic device 12 brings about the electromagnetic induction in the open terminal shown in FIG. 2, which causes the alternating current based on the frequency of the electromagnetic wave in the transistor $T_1$. The transistor $T_1$ turns on/off by the alternating current, so the current components based on the frequency of the alternating current are included in the source current detected by the detecting unit 14. The judging unit 16 judges the quality of the electronic device 12 on the basis of the source current detected by the detecting unit 14. In other words, the judging unit 16 judges the quality of the electronic device 12 by comparing the frequency components detected by the detecting unit 14 with the frequency of the electromagnetic wave. In addition, the judging unit 16 judges the quality of the electronic device 12 further on the basis of the period of the overlaid signals overlaid on the source voltage, which the power source unit 20 supplies to the electronic device 12. According to the LSI testing apparatus 100 described above, it is possible to judge the quality of the electronic device 12 with ease and high precision.

Moreover, the frequency of the electromagnetic wave generated by the electromagnetic wave generating unit 30 may be approximately the same as the frequency of the overlaid signals, which the power source unit 20 overlays on the source voltage. In this case, it is preferable that the magnitude of the alternating current generated by the electromagnetic wave generating unit 30 is a current value less than the magnitude at which the transistor $T_1$ turns on/off by a minute amount. In other words, it is preferable that the magnitude of the electromagnetic wave generated by the electromagnetic wave generating unit 30 is not bigger than but very close to a threshold value at which the transistor $T_1$ turns on/off. Due to the electromagnetic wave generated by the electromagnetic wave generating unit 30, the supply of the maximum current with which the transistor included in the electronic device 12 does not operate falsely to the gate of the transistor included in the electronic device 12 enables it to set the signal level of the overlaid signals, which the power source unit 20 overlays on the source voltage, low so that the load of the semiconductor devices included in the electronic device 12 can be reduced.

In addition, it is preferable that the electromagnetic wave generating unit 30 includes means for changing the intensity of the electromagnetic wave, which is generated. It is preferable that the electromagnetic wave generating unit 30 generates the electromagnetic wave with the intensity based on, for example, the internal voltage and capacitance of the gate of the transistor included in the electronic device 12. Moreover, it is preferable that the electromagnetic wave generating unit 30 includes means for changing the frequency of the electromagnetic wave, which is generated. For example, the test may be performed that the electromagnetic wave generating unit 30 changes the frequency of the generated electromagnetic wave slowly, and the power source unit 20 overlays the overlaid signals with a constant period on the source voltage. By changing the frequency of the electromagnetic wave generated by the electromagnetic wave generating unit 30 slowly, it is possible to perform the test effectively, while the current components of the source current resulting from the effect of the electromagnetic wave generated by the electromagnetic wave generating unit 30 are not offset continuously by the current components of the source current resulting from the effect of the overlaid signals, which the power source unit 20 overlays.

According to this embodiment, the electromagnetic wave generating unit 30 may include an electromagnetic wave generator 32 for generating the electromagnetic wave and a magnetic field adjusting unit 34 for adjusting the intensity, the frequency and the direction of the magnetic field of the electromagnetic wave generated by the electromagnetic wave generator 32. The electromagnetic wave generator 32 may have, for example, a coil. It is preferable that the magnetic field adjusting unit 34 moves the coil of the electromagnetic wave generator 32 freely in the 3rd dimensional direction and adjusts the position and/or the direction of the coil to the electronic device 12. Moreover, the electromagnetic wave generating unit 30 may include a first generator for generating the electromagnetic wave with a first frequency and a second generator for generating the electromagnetic wave with a second frequency. The first generator and the second generator are placed at the positions, where their positions are different each other. The magnetic field adjusting unit 34 adjusts the position and/or the direction of the first generator and the second generator. The first generator and the second generator may be the electromagnetic wave generator 32 described above.

The signal lines of the electronic device 12, which are placed perpendicular to the direction of the magnetic field generated by the electromagnetic wave generating unit 30, function as antenna receiving the electromagnetic wave and cause the alternating current in the signals lines. Consequently, if the input signal line of the gate of the transistor in the electronic device 12 is open, the signal line from the open part to the gate functions as the antenna, so the gate turns on/off according to the frequency of the electromagnetic wave. Due to the on/off of the gate of the transistor, the abnormal current occurs in the source current. The judging unit 16 judges whether the abnormal current results from the electromagnetic wave by analyzing the spectrum of the frequency of the abnormal current and comparing with the frequency of the electromagnetic wave.

The magnetic field adjusting unit 34 may adjust the direction etc. of the magnetic field generated by the electromagnetic wave generating unit 30 during the test. During the test, due to adjusting the direction etc. of the magnetic field, it is possible to detect the open defect in the signal lines included in the electronic device 12 in the various directions. In addition, it is preferable that the direction of the magnetic field generated by the first generator is perpendicular to the direction of the magnetic field generated by the second generator.

FIG. 7 shows the magnetic field generated by the first generator 32a and the second generator 32b. The first generator 32a and the second generator 32b may be, for example, the coils. The first generator 32a and the second generator 32b are placed in the direction approximately perpendicular to the electronic device 12. As described above, the first generator 32a and the second generator 32b are capable of moving freely by the magnetic field adjusting unit 34.

If the open signal lines included in the electronic device 12 are placed perpendicular to the direction of the magnetic field, the signal lines is capable of functioning as the antenna receiving the electromagnetic wave. However, if the open signal lines are placed parallel to the direction of the magnetic field, the signal lines does not function as the antenna. For this reason, by placing the first generator 32a and the second generator 32b at certain angle each other to the electronic device 12, the open signal lines shown in FIG. 2 are capable of functioning as the antenna for some electromagnetic waves, so it is possible to detect the open lines in all of the directions. In addition, although both the first generator 32a and the second generator 32b are placed at the sides of the electronic device 12 in FIG. 7, they may be placed at the top or the bottom of the electronic device 12 or at certain angle to a surface of the electronic device 12.

Figure 8:
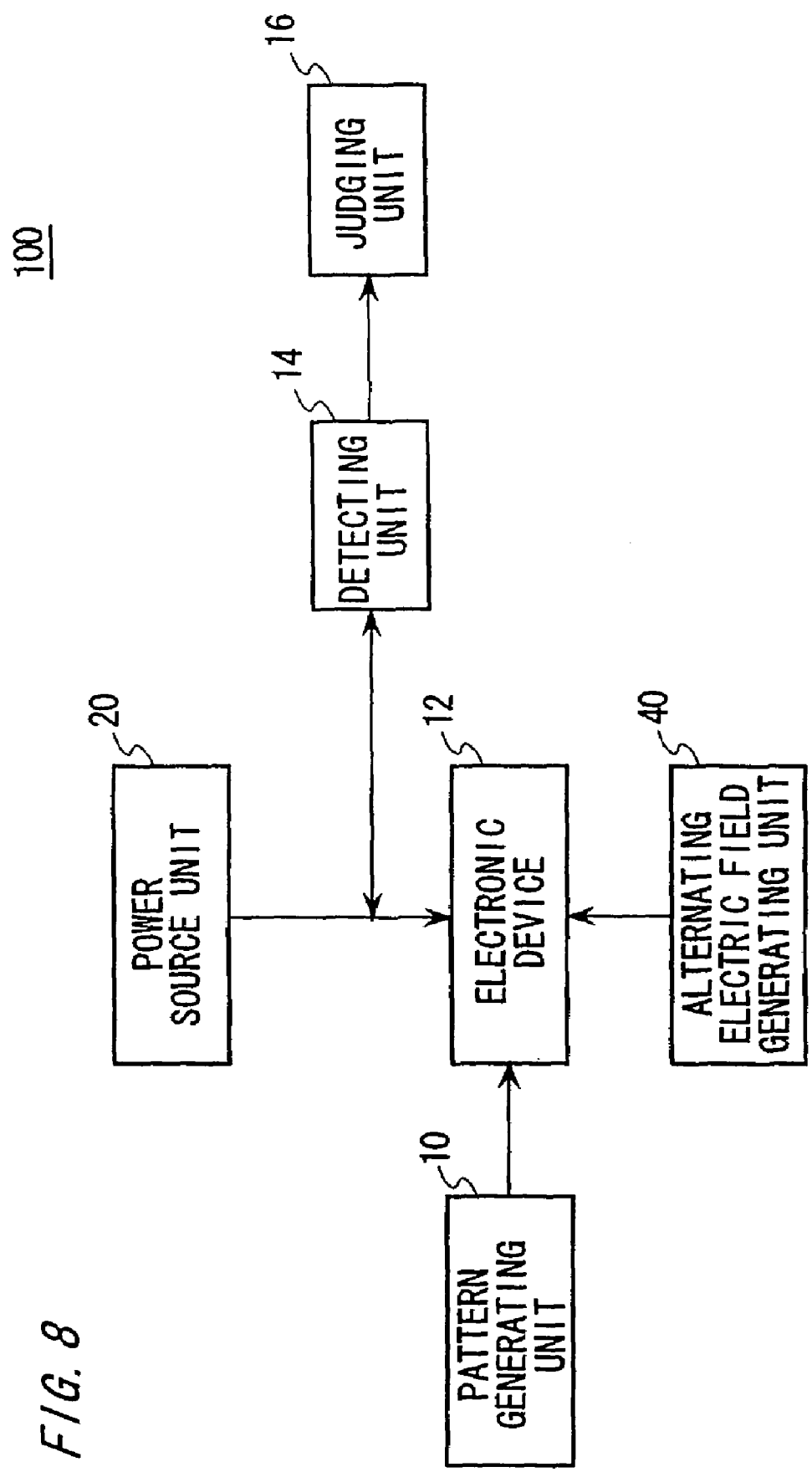
FIG. 8 shows another example of the configuration of the LSI testing apparatus 100 according to the present invention.

FIG. 8 shows another example of the configuration of the LSI testing apparatus 100 according to the present invention. The LSI testing apparatus 100 includes a pattern generating unit 10, a power source unit 20, a detecting unit 14, a judging unit 16 and an alternating electric field generating unit 40. In respect that the symbols given to FIG. 8 are the same as those of FIG. 1, they may have the same function and configuration as described regarding FIG. 1 to FIG. 5. In this embodiment, the pattern generating unit 10, the power source unit 20 and the detecting unit 14 have the same function and configuration as the pattern generating unit 10, the power source unit 20 and the detecting unit 14, which are described regarding FIG. 1 to FIG. 5.

The alternating electric field generating unit 40 generates the alternating electric field with a predetermined frequency and provides it to the electronic device 12. The judging unit 16 judges the quality of the electronic device 12 on the basis of the source current detected by the detecting unit 14 under the condition, where the alternating electric field generated by the alternating electric field generating unit 40 is provided to the electronic device 12. If the electronic device 12 includes the circuit having the open defect described in regard to FIG. 2, by providing the alternating electric field to the electronic device 12, the alternating electric field is provided to the capacitance in the gate of the transistor, where the gate signal input line is open. If the alternating electric field is provided to the capacitance in the gate, the capacitance in the gate is charged, so the gate turns on/off. Consequently, the current component based on the frequency of the alternating electric field is included in the source current detected by the detecting unit 14. The judging unit 16 judges the quality of the electronic device 12 on the basis of the frequency of the alternating electric field and the source current detected by the detecting unit 14. That is, the judging unit 16 judges the quality of the electronic device 12 by comparing the frequency components of the source current detected by the detecting 14 with the frequency of the alternating electric field. In addition, the judging unit 16 judges the quality of the electronic device 12 further on the basis of the period of the overlaid signals overlaid on the source voltage, which the power source unit 20 supplies to the electronic device 12. According to the LSI testing apparatus 100 described above, it is possible to judge the quality of the electronic device 12 with ease and high precision.

In addition, the frequency of the alternating electric field generated by the alternating electric field generating unit 40 may be approximately the same as the frequency of the overlaid signals, which the power source unit 20 overlays on the source voltage. In this case, it is preferable that the magnitude of the alternating electric field generated by the alternating electric field generating unit 40 is a current value less than the magnitude at which the transistor $T_1$ turns on/off by a minute amount. In other words, it is preferable that the magnitude of the alternating electric field generated by the alternating electric field generating unit 40 is not bigger than but very close to a threshold value at which the transistor $T_1$ turns on/off. Due to the alternating electric field generated by the alternating electric field generating unit 40, the supply of the current, which is not over but very close to the threshold value at which the transistor included in the electronic device 12 operates falsely, to the gate of the transistor included in the electronic device 12 enables it to set the signal level of the overlaid signals, which the power source unit 20 overlays on the source voltage, low so that the load of the semiconductor devices included in the electronic device 12 can be reduced.

Moreover, it is preferable that the alternating electric field generating unit 40 includes means for changing the intensity of the generated alternating electric field. It is preferable that the alternating electric field generating unit 40 generates the alternating electric field with the intensity based on, for example, the internal voltage and capacitance of the gate of the transistor included in the electronic device 12. Moreover, it is preferable that the alternating electric field generating unit 40 includes means for changing the frequency of the generated alternating electric field. For example, the test may be performed that the alternating electric field generating unit 40 changes the frequency of the generated alternating electric field slowly, and the power source unit 20 overlays the overlaid signals with a constant period on the source voltage. By changing the frequency of the alternating electric field generated by the alternating electric field generating unit 40 slowly, it is possible to perform the test effectively, while the current components of the source current resulting from the effect of the alternating electric field generated by the alternating electric field generating unit 40 are not offset continuously by the current components of the source current resulting from the effect of the overlaid signals, which the power source unit 20 overlays. In addition, the alternating electric field generating unit 40 may include an electric field probe for providing the alternating electric field individually to a plurality of the semiconductor devices included in the electronic device 12.

Figure 9:
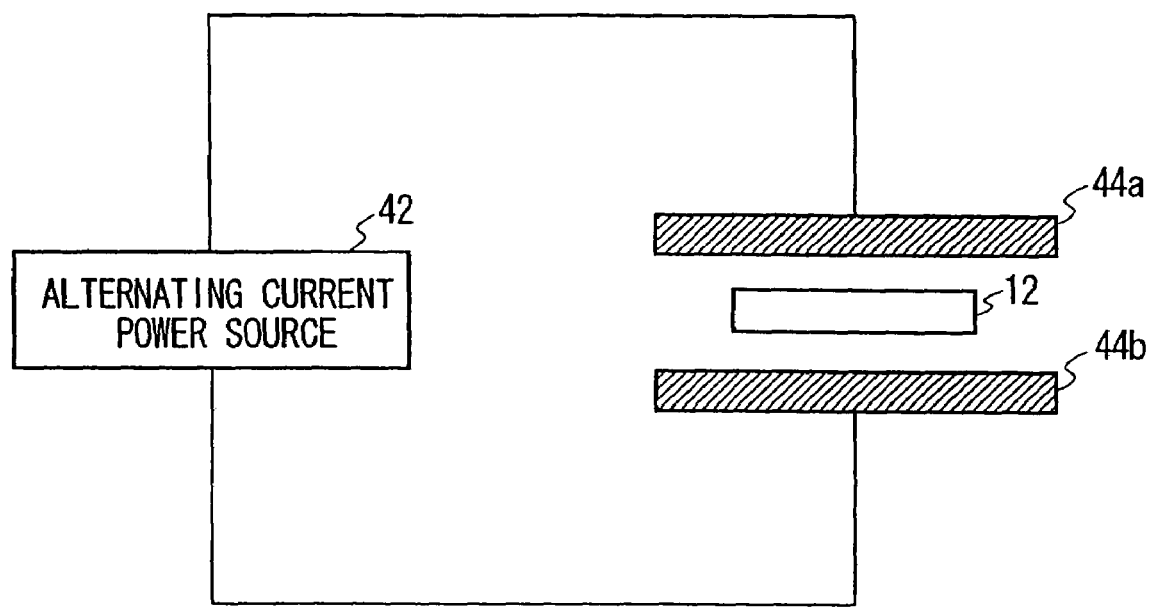
FIG. 9 shows an example of the configuration of the alternating electric field generating unit 40.

FIG. 9 shows an example of the configuration of the alternating electric field generating unit 40. The alternating electric field generating unit 40 includes an alternating current power source 42, an electrode 44*a* and an electrode 44*b*. The alternating current power source 42 supplies the electrode 44*a* and 44*b* with the alternating voltage and causes the alternating electric field between the electrode 44*a* and 44*b*. The electronic device 12 is placed between the electrode 44*a* and 44*b*, so the alternating electric field is provided to the electronic device 12. It is preferable that the alternating current power source 42 has means for changing the frequency and amplitude of the generated alternating voltage.

Figure 10:
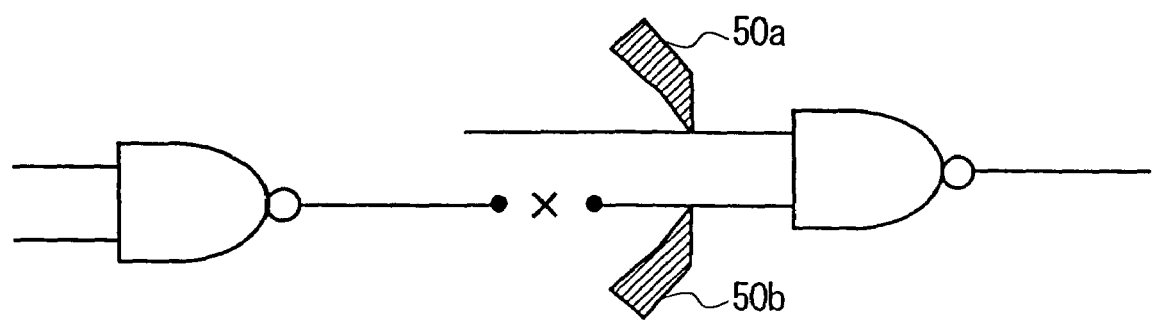
FIG. 10 shows the electric field probe included in the electronic device 12.

FIG. 10 shows the electric field probe included in the electronic device 12. The alternating electric field generating unit 40 includes an electric field probe 50*a* and an electric field probe 50*b*, which provide the alternating electric field to the input to a few of the semiconductor devices included in the electronic device 12. The electric field probe 50*a* and the electric field probe 50*b*, as shown in FIG. 10, provide the alternating electric field to the input to some of the semiconductor devices included in the electronic device 12. If the input signal line of the semiconductor devices to which the alternating electric field is provided is open, as described above, the abnormal current occurs in the source current of the electronic device 12, so it is possible to detect the open defect of the input signal line.

As described above, according to the present invention, the source current is tested by overlaying the overlaid signals on the source voltage so that it is possible to perform the test of the electronic device 12 without difficulty. In addition, due to performing the test under the condition, where the test patterns are provided, it is possible to detect the defect spot in the electronic device 12 with ease. Moreover, By performing the test under the condition, where the electromagnetic wave or the alternating electric field is provided to the electronic device 12, it is possible to perform the test with high precision, while not giving the exceeding load to the semiconductor devices.

Although the present invention has been described by way of exemplary embodiments, it should be understood that those skilled in the art might make many changes and substitutions without departing from the spirit and the scope of the present invention, which is defined only by the appended claims.

As apparent from the description above, according to the present invention, it is possible to perform the test of the electronic device 12 without difficulty. In addition, it is possible to detect the defect spot in the electronic device 12 with ease.

What is claimed is:

1. An LSI testing apparatus for testing an electronic device comprising:
    a power source unit for supplying a source voltage of direct current to said electronic device;
    a detecting unit for detecting a source current with which said electronic device is supplied by said power source unit; and
    a judging unit for judging quality of said electronic device,
    wherein said power source unit comprises means for overlaying an overlaid signal with a predetermined period on said source voltage, and said judging unit judges said quality of said electronic device on the basis of said source current detected by said detecting unit in case said electronic device is supplied with said source voltage on which said overlaid signal is overlaid, and
    further comprising an alternating electric field generating unit for generating an alternating electric field with a predetermined frequency to said electronic device, wherein said judging unit judges said quality of said electronic device on the basis of said source current detected by said detecting unit under a condition, where said alternating electric field generated by said alternating electric field generating unit is provided to said electronic device.

2. The LSI testing apparatus as claimed in claim 1, wherein said frequency of said alternating electric field generated by said alternating electric field generating unit is approximately the same as a frequency of said overlaid signal.

3. The LSI testing apparatus as claimed in claim 1, wherein said alternating electric field generating unit comprises means for changing an intensity of said alternating electric field.

4. The LSI testing apparatus as claimed in claim 1, wherein said alternating electric field generating unit comprises means for changing a frequency of said alternating electric field.

5. The LSI testing apparatus as claimed in claim 1, wherein said judging unit judges said quality of said electronic device further on the basis of said frequency of said alternating electric field generated by said alternating electric field generating unit.

6. The LSI testing apparatus as claimed in claim 1, wherein said electronic device comprises a plurality of semiconductor devices to which said power source unit supplies said source current on which said overlaid signal is overlaid, and said alternating electric field generating unit comprises an electric field probe for providing said alternating electric field to an input to at least one of said plurality of semiconductor devices.

* * * * *